(12) United States Patent
Werner

(10) Patent No.: US 6,324,059 B1
(45) Date of Patent: Nov. 27, 2001

(54) APPARATUS AND METHOD FOR IMPROVING HEAT SINK COMPONENT CAPACITY AND EFFICIENCY

(76) Inventor: Paul L. Werner, 3013 Faulkner Dr., Rowlett, TX (US) 75088

( * ) Notice: Subject to any disclaimer, the term of this patent is extended or adjusted under 35 U.S.C. 154(b) by 0 days.

(21) Appl. No.: 09/425,090

(22) Filed: Oct. 22, 1999

(51) Int. Cl.[7] ................................................ H05K 7/20
(52) U.S. Cl. .................... 361/704; 361/710; 165/80.3; 257/707; 174/16.3
(58) Field of Search .................. 361/690–699, 361/700–712, 715–727, 738, 752; 165/80.2, 80.3, 80.4, 185, 905; 174/16.3, 52.4, 35 MS, 254; 257/676, 668, 706–727, 698; 411/522, 516, 520; 24/295, 457, 458, 530, 531, 568, 570; 403/372; 267/160, 164; 248/316.7

(56) References Cited

U.S. PATENT DOCUMENTS

| D. 296,323 | * | 6/1988 | McCarthy | D13/23 |
| D. 313,399 | * | 1/1991 | Earl et al. | D13/23 |
| 4,104,701 | * | 8/1978 | Baranowski | 361/386 |
| 4,933,746 | * | 6/1990 | King | 357/81 |
| 5,461,541 | * | 10/1995 | Wentland et al. | 361/707 |
| 5,926,369 | * | 7/1999 | Ingraham et al. | 361/699 |
| 5,995,369 | * | 11/1999 | Kiermeier et al. | 361/704 |

FOREIGN PATENT DOCUMENTS

410256440A * 9/1998 (JP) .

* cited by examiner

Primary Examiner—Gerald Tolin
Assistant Examiner—Michael Datskovsky

(57) ABSTRACT

A heat sink assembly of a heat sink having first and second interior opposing planar surfaces joined together by a third interior planar surface and an electronic component mounting apparatus. The electronic component mounting apparatus may be a resilient metal strip of a defined length having first and second ends, configured so that the first end engages an electronic component mounted against the first interior planar surface and the second end engages the opposing second interior planar surface, with the defined length of the strip springably securing the electronic component against the first interior surface.

21 Claims, 2 Drawing Sheets

APPARATUS AND METHOD FOR IMPROVING HEAT SINK COMPONENT CAPACITY AND EFFICIENCY

TECHNICAL FIELD OF THE INVENTION

The present invention is directed, in general, to cooling apparatus for electronic components and, more specifically, to a apparatus and method for improving heatsink component capacity and efficiency.

BACKGROUND OF THE INVENTION

A concern of electronic circuit designers is the control of component heat that builds up during circuit operation unless such heat is dissipated. Temperature control is vital to circuit reliability to prevent individual component failure as well as a consequent circuit failure caused by failed components. The preferred control method for component and circuit heat is to dissipate the excess heat into the atmosphere before temperatures rise to a level where damage can occur. Heat dissipation is usually accomplished by associating heat transfer devices, such as heat sinks, with the heat generating components to absorb component heat and radiate the excess heat into the surrounding atmosphere. Frequently, the component is mounted directly on the heat transfer device to more efficiently remove excess component heat.

The problems associated with heat control have become more pronounced as low profile and compact electronic systems have become the preferred choice of customers. These low profile and compact systems typically have design parameters that make it difficult to find space for all the required electronic components on the substrate of a printed wiring or circuit board, much less the heat transfer devices such components require to prevent heat related damage. For example, the specifications for a certain electronic system may call for a printed wiring or circuit board of not more than 125 square inches with a component height no greater than 1.24 inches. Within this limited space, over a thousand electronic components must be accommodated as well as the associated heat transfer devices necessary to remove over 100 watts of heat generated by the components.

A number of heat sinks are available on the commercial market that would otherwise be suitable for use in a compact or low profile electronic device, except for the fact that these they are only designed to accommodate only one or two electronic devices. This makes the use of these commercially available heat sinks generally unacceptable for use in low profile and compact electronic assemblies because there is not enough space on the electronic substrate to accommodate all the heat sinks required.

Although commercially available heat sinks are generally not satisfactory for use on electronic substrates designed for low profile and compact electronic assemblies, they have certain qualities that would make them attractive to designers and manufactures, if the space problem could be overcome. Some of the attractive features are their ready availability, the relatively low cost, and reliability.

In many circuits it is not uncommon to find as many as four electronic devices located in a position on the electronic substrate that could be attached to a single heat sink. In such cases, the proximity of the electronic devices also produces other desirable benefits, such as reduced pin tolerance from device to device and reduced electromagnetic interference (EMI).

Accordingly, what is needed in the art is a device and method to mount more than two electronic components on a commercially available heat sink designed for only two components. Specifically such a device should permit generally available, inexpensive heat sinks to by used on the electronic substrate of compact and low profile electronic systems. The device should permit the easy and efficient mounting of electronic components thereon, while only using a minimum number of parts.

SUMMARY OF THE INVENTION

To address the above-discussed deficiencies of the prior art, the present invention provides a heat sink assembly of a heat sink having first and second interior opposing planar surfaces joined together by a third interior planar surface and an electronic component mounting apparatus. The electronic component mounting apparatus is a resilient metal strip of a defined length having first and second ends, configured so that the first end engages an electronic component mounted against the first interior planar surface and the second end engages the opposing second interior planar surface, with the defined length of the strip springably securing the electronic component against the first interior surface.

The present invention, therefore, sets forth an apparatus for mounting electronic components on an electronic substrate. The apparatus comprises a heat sink with interior surfaces to which electronic components are secured in a novel way by the use of a resilient strip or clip.

In one embodiment of the present invention the resilient metal strip is configured so that the second end of the strip engages an electronic component mounted against the second interior planar surface of the heat sink and springably secures the electronic component against the second interior surface. In another embodiment, an electronic component is mounted on the third interior planar surface of the heat sink. In still another embodiment, the heat sink has an obverse interior planar surface on the opposite side of the third interior planar surface and an electronic component mounted on such obverse interior planar surface. In still another embodiment the electronic component mounting apparatus further has first and second end extensions coupled to the first and second ends, respectively, that are engageable with fins of the heat sink to further hold the electronic component mounting apparatus in place.

An advantageous embodiment of the heat sink assembly provides for the resilient metal strip to be configured so that it engages electronic components mounted against the first and second opposing planar surfaces and springably secures the components against such opposing planar surfaces. A further aspect of the invention is that the resilient metal strip springably securing the electronic components against the first and second opposing planar surfaces is configured to form an arc around an electronic component mounted on the third interior planar surface. The invention thus introduces an apparatus for mounting multiple electronic components to a heat sink that previously could be used to only mount one or two electronic components.

The invention also provides for an electronic wiring or circuit board substrate with a heat sink assembly of a heat sink, with first and second interior opposing planar surfaces joined together by a third interior planar surface, and an electronic component mounting apparatus of a resilient metal strip of a defined length having first and second ends, configured so that the first end engages an electronic component mounted against the first interior planar surface and the second end engages the opposing second interior planar surface to springably secure the electronic component against the first interior surface. The invention also provides for a method of forming a heat sink assembly of a heat sink, electronic components and a resilient metal strip securing certain of the electronic components to the heat sink.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
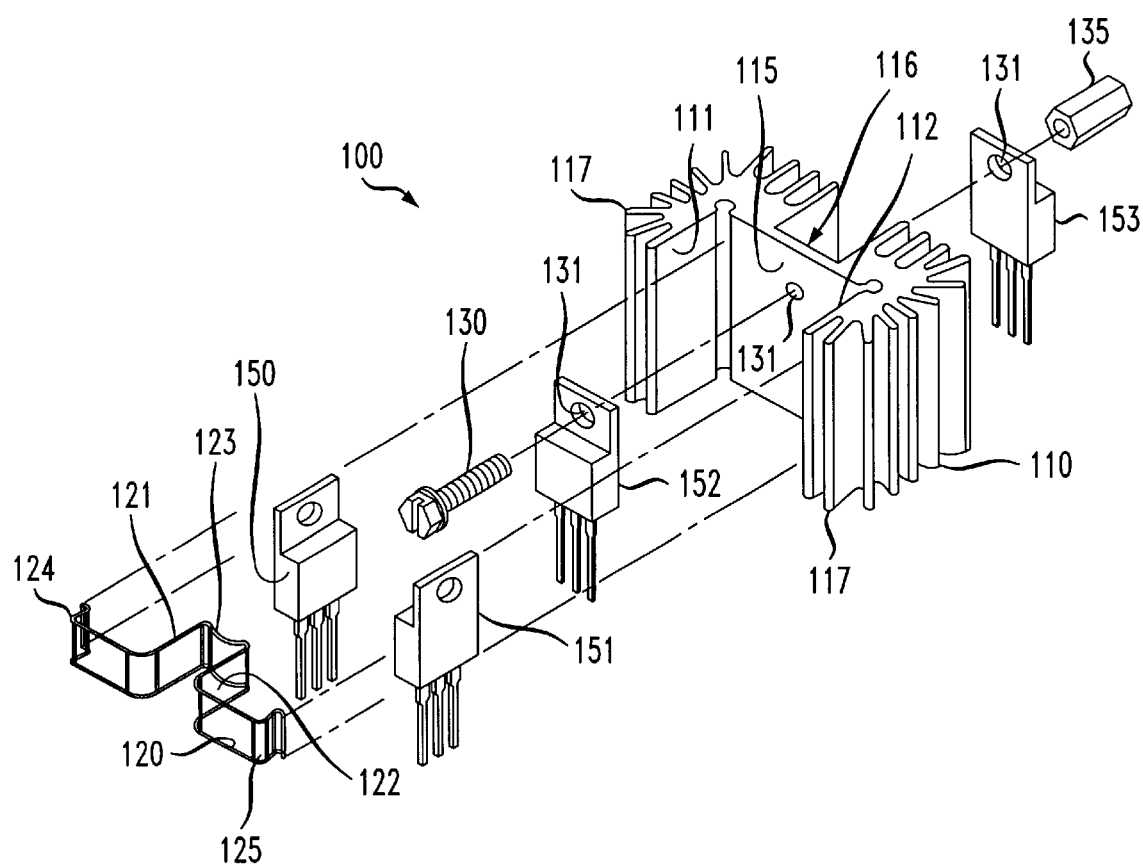
FIG. 1 illustrates an isometric view of a heat sink assembly made up of a heat sink, four electronic components to be mounted on the surfaces of the heat sink, and an electronic component mounting apparatus.
Figure 1A:
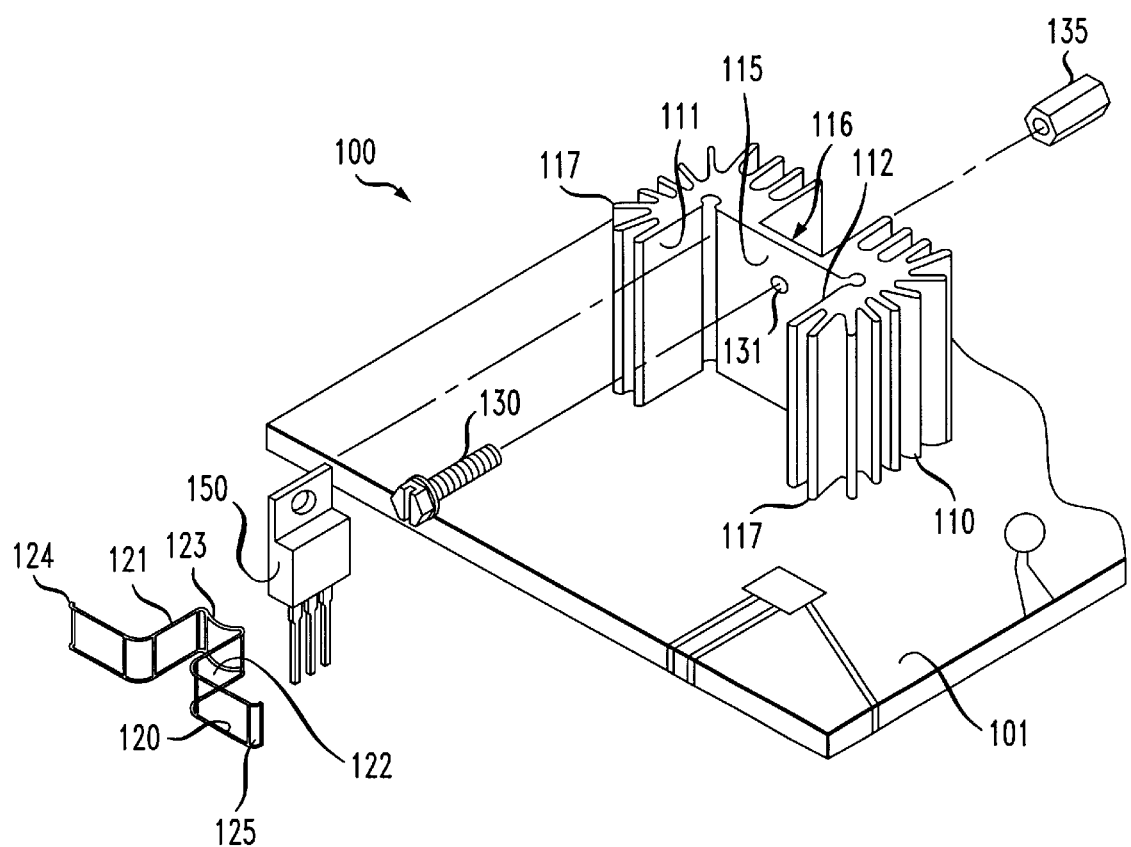

Referring initially to FIG. 1, illustrated is an isometric view of a heat sink assembly 100 made up of a heat sink 110, four electronic components 150, 151, 152, 153 to be mounted on the surfaces of the heat sink 110, and an electronic component mounting apparatus 120.

The heat sink 110 has first 111 and second 112 interior opposing planar surfaces, joined together by a third interior planar surface 115. The electronic component mounting apparatus 120 is a resilient metal strip of a defined length having first 121 and second 122 ends. The apparatus 120 is configured so that the first end 121 engages an electronic component 150 mounted against the first interior planar surface 111 and the second end 122 engages a second electronic component 151 mounted against the opposing second interior surface 112. The defined length of the apparatus 120 springably holds the electronic components 150, 151 in position against the respective interior opposing planar surfaces 111, 112. Those of ordinary skill in the art will recognize that the second end 122 may only be engaging the opposing second interior planar surface 112 with the defined length of the apparatus springably securing only the electronic component 150 against the first interior surface 111. In short, the electronic mounting apparatus 120 serves as a clip to secure at least one electronic component 150 to one of the opposing interior surfaces 111, 112 of the heat sink 110.

The illustrated combination of the electronic component mounting apparatus 120 and the heat sink 110 provides a heat sink assembly 100 that can be used to mount four electronic components 150, 151, 152, 153 on an electronic substrate. The heat sink 110 has an obverse interior planar surface 116 on the opposite side of the third interior planar surface 115 on which an electronic component 153 will be mounted. In this embodiment, two of the electronic components 150, 151 are secured to the first 111 and second 112 opposing interior surfaces, respectively, by the electronic component mounting apparatus 120, as herein explained. Two of the electronic components 152 and 153 are secured to the third interior planar surface 115 and the obverse interior planar surface 116 by conventional methods, in this case a bolt 130 and a hexagonal threaded standoff nut 135.

The bolt 130 is inserted through the holes 131 on the heat sink 100 and the electronic components 152, 153. The nut 135 used to secure the components 152, 153 to the heat sink 110 is hexagonal shaped so that a wrench or socket to thread the nut 135 onto the end of the bolt 130 can be accommodated. The heat sink 110 configuration prohibits the use of a similar fastening mechanism to hold the electronic components 151, 152 on the opposing interior planar surfaces 111, 112 of the heat sink 100. The confines of the space between the opposing interior surfaces 111, 112 of the heat sink 100 make it difficult, if not impossible, to secure components 150, 151 to such surfaces 111, 112 by conventional means. However, if the electronic component mounting apparatus 120 is used, electronic components 150, 151 can be secured to the interior opposing surfaces 111, 112 with ease. Another advantage of using the electronic component mounting apparatus 120 is that it is readily releasable for maintenance and assembly purposes. The invention has thus introduced an apparatus for mounting multiple electronic components 150, 151, 152, 153 to a heat sink 100 that previously could mount only one or two electronic components.

To permit electronic components 150, 151 to be secured to the interior opposing planar surfaces 111, 112 when an electronic component 152 is fastened to the third interior planar surface 115, one embodiment of the present invention calls for the electronic component mounting apparatus 120 to be configured with an arc 123 that can go around an electronic component 152 mounted on the third interior planar surface 115. This is advantageous if the apparatus 120 would otherwise contact the component 152 and cause a short. In other cases where the apparatus would touch a non conductive portion of the component 152, the arc 123 can press directly against the component 152 and provide additional support.

In another embodiment of the invention, the electronic component mounting apparatus 120 has first 124 and second 125 end extensions coupled to the first 121 and second 122 ends, respectively. The first 124 and second 125 end extensions are configured so that each would engage a fin 117 on the heat sink 110 to provide further support to hold the electronic component mounting apparatus 120 in place.

The invention provides for an electronic wiring or circuit board substrate 101 with a heat sink assembly 100 that has a heat sink 110, with first 111 and second 112 interior opposing planar surfaces joined together by a third interior planar surface 115, and an electronic component mounting apparatus 120 of a resilient metal strip of a defined length having first 121 and second 122 ends. The invention also provides for a method of forming a heat sink 100 assembly of a heat sink 110, electronic components 150, 151, 152, 153 and an electronic component mounting apparatus 120 securing certain of the electronic components 150, 151 to the heat sink 110.

Although the present invention has been described in detail, those skilled in the art should understand that they can make various changes, substitutions and alterations herein without departing from the spirit and scope of the invention in its broadest form. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A heat sink assembly, comprising:
   a heat sink having first and second interior opposing planar surfaces joined together by a third interior planar surface; and
   an electronic component mounting apparatus having a resilient metal strip of a defined length having first and second ends, said strip configured so that said first end engages an electronic component mounted against said first interior planar surface, said second end configured to engage said opposing second interior planar surface, said defined length of said strip springably securing said electronic component against said first interior surface.

2. The heat sink assembly as recited in claim 1 wherein said strip is configured so that said second end engages an electronic component mounted against said second interior planar surface, said defined length of said strip springably securing said electronic component against said second interior surface.

3. The heat sink assembly as recited in claim 1 wherein an electronic component is mounted on said third interior planar surface.

4. The heat sink assembly as recited in claim 1 wherein said heat sink has an obverse interior planar surface on the opposite side of said third interior planar surface and an electronic component is mounted on said obverse interior planar surface.

5. The heat sink assembly as recited in claim 1 wherein said electronic component mounting apparatus further has first and second end extensions coupled to said first and second ends, respectively, said first and second end extensions engageable with fins of said heat sink further to hold said electronic component mounting apparatus in place.

6. The heat sink assembly as recited in claim 1 wherein said strip is configured to engage electronic components mounted against said first and second opposing planar surfaces, said defined length of said strip springably securing said electronic components against said first and second opposing planar surfaces.

7. The heat sink assembly as recited in claim 6 wherein said strip springably securing said electronic components against said first and second opposing planar surfaces is configured to form an arc around an electronic component mounted on said third interior planar surface.

8. A circuit board substrate, comprising:
    a heat sink assembly, having a heat sink with first and second interior opposing planar surfaces joined together by a third interior planar surface; and
    an electronic component mounting apparatus having a resilient metal strip of a defined length having first and second ends, said strip configured so that said first end engages an electronic component mounted against said first interior planar surface, said second end configured to engage said opposing second interior planar surface, said defined length of said strip springably securing said electronic component against said first interior surface.

9. The circuit board substrate as recited in claim 8 wherein said strip is configured so that said second end engages an electronic component mounted against said second interior planar surface, said defined length of said strip springably securing said electronic component against said second interior surface.

10. The circuit board substrate as recited in claim 8 wherein an electronic component is mounted on said third interior planar surface.

11. The circuit board substrate as recited in claim 8 wherein said heat sink has an obverse interior planar surface on the opposite side of said third interior planar surface and an electronic component is mounted on said obverse interior planar surface.

12. The circuit board substrate as recited in claim 8 wherein said electronic component mounting apparatus further has first and second end extensions coupled to said first and second ends, respectively, said first and second end extensions engageable with fins of said heat sink further to hold said electronic component mounting apparatus in place.

13. The circuit board substrate as recited in claim 8 wherein said strip is configured to engage electronic components mounted against said first and second opposing planar surfaces, said defined length of said strip springably securing said electronic components against said first and second opposing planar surfaces.

14. The circuit board substrate as recited in claim 13 wherein said strip springably securing said electronic components against said first and second opposing planar surfaces is configured to not contact an electronic component mounted on said third interior planar surface.

15. A method of forming a heat sink assembly, comprising:
    selecting a heat sink having first and second interior opposing planar surfaces joined together by a third interior planar surface; and
    forming an electronic component mounting apparatus having a resilient metal strip of a defined length having first and second ends, said strip configured so that said first end engages an electronic component mounted against said first interior planar surface, said second end configured to engage said opposing second interior planar surface, said defined length of said strip springably securing said electronic component against said first interior surface.

16. The method of forming a heat sink assembly as recited in claim 15 wherein said strip is configured so that said second end engages an electronic component mounted against said second interior planar surface, said defined length of said strip springably securing said electronic component against said second interior surface.

17. The method of forming a heat sink assembly as recited in claim 15 wherein an electronic component is mounted on said third interior planar surface.

18. The method of forming a heat sink assembly as recited in claim 15 wherein said heat sink has an obverse interior planar surface on the opposite side of said third interior planar surface, said method comprising mounting an electronic component on said obverse interior planar surface.

19. The method of forming a heat sink assembly as recited in claim 15 wherein said electronic component mounting apparatus further has first and second end extensions coupled to said first and second ends, respectively, said first and second end extensions engageable with fins of said heat sink further to hold said electronic component mounting apparatus in place.

20. The method of forming a heat sink assembly as recited in claim 15 wherein said strip is configured to engage electronic components mounted against said first and second opposing planar surfaces, said defined length of said strip springably securing said electronic components against said first and second opposing planar surfaces.

21. The method of forming a heat sink assembly as recited in claim 20 wherein said strip springably securing said electronic components against said first and second opposing planar surfaces is configured to form an arc around an electronic component mounted on said third interior planar surface.

* * * * *